(12) United States Patent
Lim (10) Patent No.: US 8,598,698 B1
(45) Date of Patent: Dec. 3, 2013

(54) PACKAGE SUBSTRATE WITH AN EMBEDDED STIFFENER

(75) Inventor: Ken Beng Lim, Bayan Lepos (MY)

(73) Assignee: Altera Corporation, San Jose, CA (US)

( * ) Notice: Subject to any disclaimer, the term of this patent is extended or adjusted under 35 U.S.C. 154(b) by 303 days.

(21) Appl. No.: 12/841,104

(22) Filed: Jul. 21, 2010

(51) Int. Cl.
*H01L 21/02* (2006.01)

(52) U.S. Cl.
USPC ............ 257/698; 257/E21.503; 257/E23.068; 438/625; 175/255

(58) Field of Classification Search
USPC .................. 257/734, E23.142, 698, E21.503, 257/E23.068; 438/625; 174/255
See application file for complete search history.

(56) References Cited

U.S. PATENT DOCUMENTS

| | | | |
|---|---|---|---|
| 7,375,288 B1 * | 5/2008 | Ch'ng et al. ................. | 174/260 |
| 7,405,247 B2 * | 7/2008 | Sachdev et al. .............. | 523/457 |
| 7,635,641 B2 * | 12/2009 | Hurwitz et al. ............... | 438/612 |
| 2008/0014336 A1 * | 1/2008 | Asai et al. ..................... | 427/97.6 |
| 2011/0024898 A1 * | 2/2011 | Leung et al. .................. | 257/734 |

* cited by examiner

*Primary Examiner* — John C Ingham
(74) *Attorney, Agent, or Firm* — Womble Carlyle Sandridge & Rice LLP (57) ABSTRACT

An integrated circuit (IC) package substrate with an embedded stiffener is disclosed. The IC package substrate is a multilayer package substrate that has build-up layers and metal layers stacked up alternately and a core layer in between the multiple build-up and metal layers. The core layer has an embedded stiffener that surrounds a perimeter of the core layer. Metal layers and build-up layers that are stacked alternately are placed on each surface of the core layer. Each metal layer has transmission traces and each build-up layer has vias that connect the transmission traces on one metal layer to the transmission traces on another metal layer. The embedded stiffener in the IC package substrate creates a more stable IC package structure and may eliminate the need to have a stiffener in addition to the IC package substrate.

20 Claims, 8 Drawing Sheets

PACKAGE SUBSTRATE WITH AN EMBEDDED STIFFENER

BACKGROUND

There are many types of different integrated circuit (IC) packages that cater to different applications. Some of the more common IC packages include flip chip and wire-bond ball grid array (BGA) packages. IC packages like BGA packages typically include an IC chip and other components, such as on-package de-coupling (OPD) capacitors placed on a substrate. Generally speaking, IC packages may also include a heat spreader or a lid.

A two-piece lid is usually employed in a typical BGA package. The two-piece lid is formed by attaching a stiffener to sides of the top surface of the package substrate and attaching a heat spreader to the stiffener. Usually, the lid is affixed to the perimeter of the package substrate, taking up valuable space that can otherwise be used for the placement of various components. In other words, a substantial area, or at least the perimeter area, on the surface of the package substrate has to be reserved for the stiffener in the two-piece lid.

Occasionally, a channel lid is used in place of a two-piece lid. Using a channel lid frees up some space on the package substrate. However, the channel lid does not completely free up the space on the perimeter of the package substrate as at least two sides of the perimeter of the package substrate still needs to be reserved for the "legs" of the channel lid. Furthermore, the channel lid, compared to the two-piece lid, has limited holding strength and increases the warpage of the package.

Because of these limitations, a larger package substrate would generally be required for a larger IC since more passive components, e.g., chip capacitors, are required in a device. However, simply enlarging the package substrate is neither a viable nor a cost-effective solution because using a larger package substrate increases manufacturing risks and packaging cost.

Therefore, it is desirable to have accurate a package substrate that can accommodate different types of heat spreaders or lids that take up substantially less area on the package substrate. It is also desirable to have an IC package that can accommodate all the different components without further expanding the size of the package substrate.

It is within this context that the invention arises.

SUMMARY

Embodiments of the present invention include apparatuses and a method for creating an IC package substrate with a non-uniform dielectric layer thickness.

It should be appreciated that the present invention can be implemented in numerous ways, such as a process, an apparatus, a system, or a device. Several inventive embodiments of the present invention are described below.

In one embodiment, an IC package substrate is disclosed. The IC package substrate is a multi-layer substrate with build-up and metal layers stacked alternately with a core layer placed in between the stacked build-up and metal layers. The core layer has a through hole that extends between opposing surfaces of the core layer and an embedded stiffener surrounding the perimeter of the core layer. The metal layers have transmission traces and the build-up layers have multiple vias that connect the traces on one metal layer to the traces on another metal layer.

In another embodiment in accordance with the present invention, an IC package is disclosed. The IC package includes a package substrate with multiple build-up and metal layers stacked alternately. A stiffener is embedded in at least one of the build-up layers. In one embodiment, the build-up layers include at least one core layer and the stiffener is embedded in the core layer. An IC is disposed on a surface of the package substrate and a heat spreader is disposed over the IC.

In yet another embodiment, another IC package substrate is disclosed. The IC package substrate has multiple build-up layers stacked alternately with multiple metal layers. The build-up layers have vias that connect a build-up layer with an adjacent metal layer. At least one of the build-up layers has an embedded stiffener placed at its perimeter. The vias on that particular build-up layer are placed such that at least a portion of the vias overlaps the inner boundary of the stiffener. An insulation layer is placed between the portion of the vias and the adjacent inner boundary to insulate the vias from the inner boundary of the stiffener.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe an integrated circuit (IC) package substrate with an embedded stiffener.

It will be obvious, however, to one skilled in the art, that the present invention may be practiced without some or all of these specific details. In other instances, well-known operations have not been described in detail in order not to unnecessarily obscure the present invention.

The embodiments described herein describe techniques to create an IC package substrate with an embedded stiffener for better warpage control. Generally, the substrate layers are formed by having multiple dielectric and metal layers stacked alternately. Signals from the IC chip are transmitted through the traces on the metal layers of the substrate to the solder balls at the bottom of the package before being routed out on the PCB. One embodiment describes a package substrate with a stiffener embedded in a core layer. For example, the stiffener may be placed around a perimeter of the core layer to enhance the overall structure of the IC package substrate. In one embodiment, the stiffener is a metal stiffener that is placed in the dielectric core layer. The through-hole is usually drilled through the core layer to allow electrical connections to be made between the metal layers on the top surface of the core layer with the metal layers at the bottom surface of the core layer. In one embodiment, the stiffener is placed around the perimeter and close to the sides of the core layer so that the stiffener does not extend beyond the through-hole or any vias that connect the core layer with other metal and build-up layers.

Figure 1:
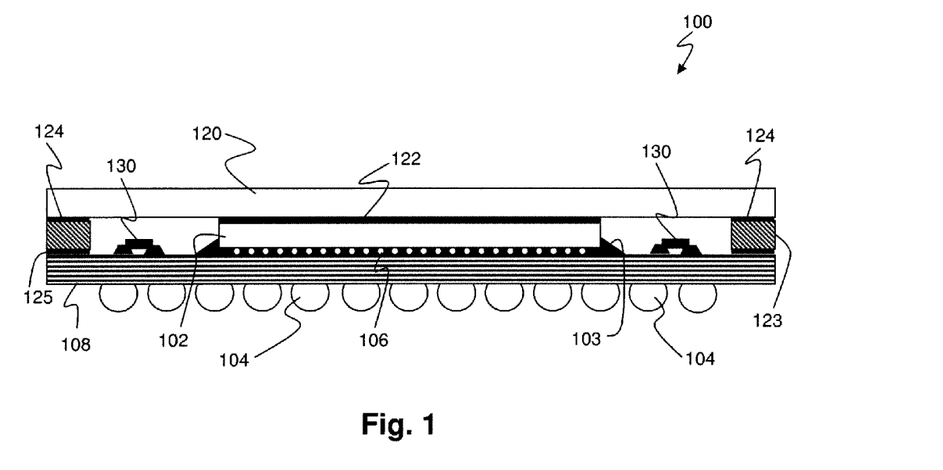
FIG. 1, meant to be illustrative and not limiting, shows an exemplary flip chip ball grid array (BGA) IC package with a two-piece lid.

FIG. 1, meant to be illustrative and not limiting, shows an exemplary flip chip ball grid array (BGA) IC package 100 with lid 120 and support member 123 forming a 2-piece lid. IC 102, placed on one side of package substrate 108, is flipped and is connected to package substrate 108 through solder bumps 106. The cavity between package substrate 108 and solder bumps 106 is filled with underfill 103. Underfill 103 is a sealing resin that is used to fill the gap and protect the solder joints between solder bumps 106 and package substrate 108. Passive components, e.g., on-package de-coupling (OPD) capacitors 130, may be placed on package substrate 108, around IC 102. Thermal interface material (TIM) 122 is placed in between IC 102 and lid 120 for better heat dissipation. In an exemplary embodiment, support member 123 is a metal stiffener.

Referring still to FIG. 1, adhesive 124 connects support member 123 to lid 120 and adhesive 125 connects support member 123 to build-up substrate 108. It should be appreciated that adhesive material 124 may be different from or similar to adhesive material 125. Typically, support member 123 takes up a perimeter space of more than 3 mm wide on the surface of package substrate 108, leaving limited space on package substrate 108 for the placement of active and passive components like IC 102 and capacitors 130, respectively. Solder balls 104 are disposed on an opposite side of package substrate 108. Signals from IC 102 travel through solder bumps 106, package substrate 108 and solder balls 104 to external components. IC package 100 may be mounted on a printed circuit board (PCB) in one embodiment. Substrate 108, through solder bumps 106 and solder balls 104, electrically connects IC 102 to the PCB that IC package 100 is mounted on. In one embodiment, substrate 108 is a multilayer substrate that is formed by metallization and dielectric layers stacked alternately around a core.

Figure 2A:
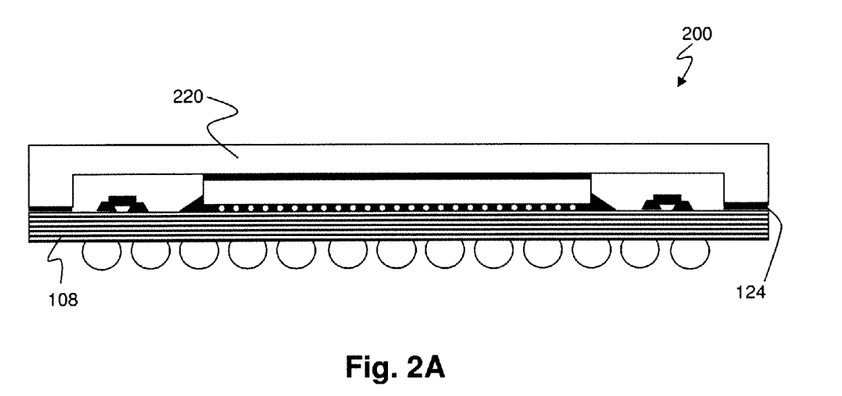
FIG. 2A, meant to be illustrative and not limiting, shows yet another typical IC package with a channel lid.

FIG. 2A, meant to be illustrative and not limiting, shows yet another typical IC package 200 with channel lid 220. IC package 200 shares many similarities with IC package 100 of FIG. 1. For the sake of brevity, components already shown in IC package 100 of FIG. 1 and described above are not repeated. The difference between IC package 200 and IC package 100 is that IC package 200 uses channel lid 220 instead of two-piece lid 120 as shown in FIG. 1. Channel lid 220 is a single piece or monolithic lid that is attached to two sides of package substrate 108 with adhesive 124. Channel lid 220 therefore frees up two of the sides on the surface of package substrate 108.

Figure 2B:
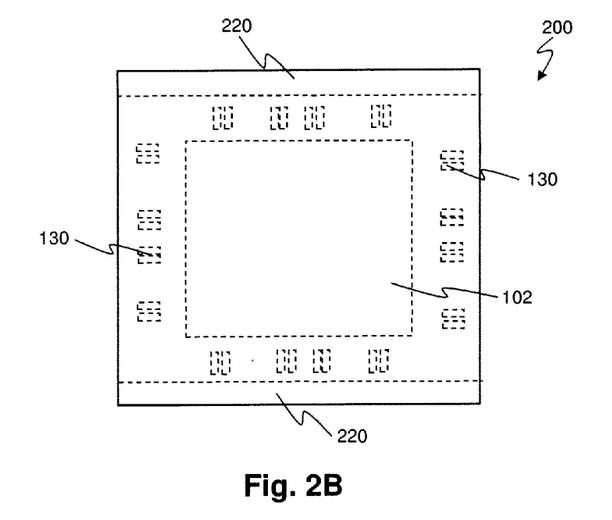
FIG. 2B, meant to be illustrative and not limiting, shows a top-down view of the IC package of FIG. 2A.

FIG. 2B, meant to be illustrative and not limiting, shows a top-down view of IC package 200. Unlike the two-piece lid 120 of FIG. 1 that is attached to four sides of the top surface of package substrate 108, channel lid 220 is attached to only two sides of the top surface of package substrate 108. The space that would otherwise be occupied by support member or metal stiffener 123 of FIG. 1 can be utilized by the many components, e.g., IC 102 and capacitors 130, in IC package 200. For instance, more capacitors 130 can be placed on the two unoccupied sides of package substrate 108 in IC package 200. However, because there is less contact area between channel lid 220 and package substrate 108, IC package 200 may be less reliable and may have a higher warpage, which may impact the performance and reliability of the IC.

Figure 3A:
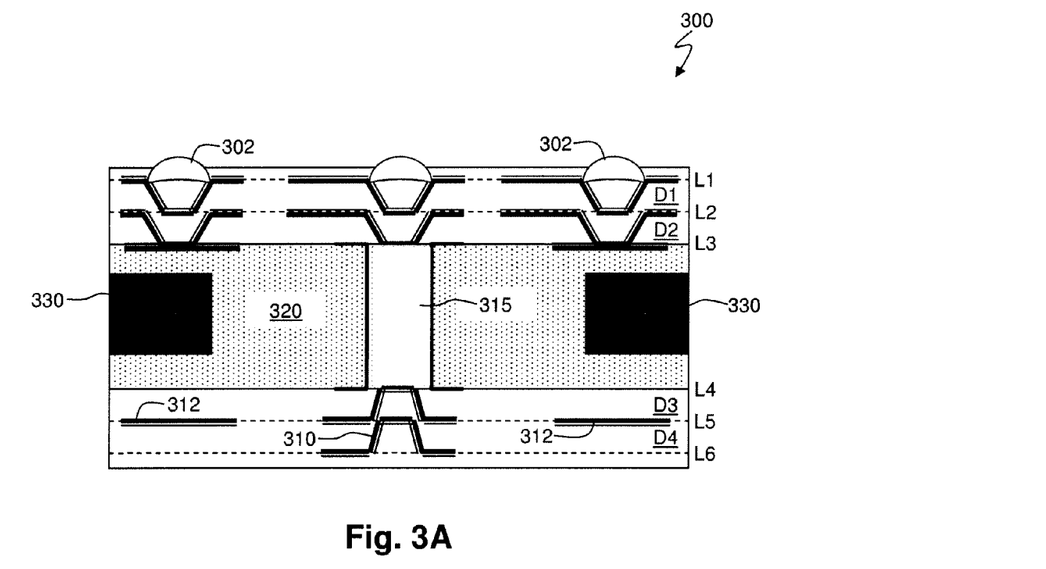
FIG. 3A, meant to be illustrative and not limiting, shows a simplified schematic diagram depicting layers in an exemplary multilayer package substrate as one embodiment in accordance with the present invention.

FIG. 3A, meant to be illustrative and not limiting, shows a simplified schematic diagram depicting layers in exemplary multilayer package substrate 300 as one embodiment in accordance with the present invention. The illustrative embodiment of FIG. 3A is a more detailed representation of a package substrate used in various IC packages, e.g., package substrate 108 of IC package 100 in FIG. 1. Generally, a multilayer ball grid array (BGA) package includes bumps, transmission lines, micro-vias, through-holes and BGA balls. However, one skilled in the art should appreciate that some components, e.g., bumps, and BGA balls, are not shown in FIG. 3A for illustrative purposes. Metal layers L1-L6 are stacked alternately with build-up layers D1-D4. Metal layers L1-L6 are conductive layers with transmission traces, power and ground planes 312. Build-up layers D1-D4 are generally non-conductive or dielectric layers that with vias 310 that electrically connect one metal layer adjacent to a top surface of a dielectric layer to another metal layer adjacent to the bottom surface of the dielectric layer. Examples of non-conductive materials typically used in build-up layers include, among others, bismaleimide triazine (BT) and Ajinomoto Build-up Film (ABF).

Referring still to FIG. 3A, core layer 320 is placed in between stacked metal layers L1-L6 and dielectric layers D1-D4. In the embodiment of FIG. 3A, stiffener 330 is embedded in core layer 320 of package substrate 300. In one embodiment, core layer 320 is a non-conductive layer made up of reinforced polymer, e.g., BT, and stiffener 330 is a conductive layer. In the embodiment of FIG. 3A, stiffener 330 is metal, e.g., copper (Cu). It should be appreciated that other non-conductive materials with a coefficient of thermal expansion (CTE) that is relatively close to the CTE of the package substrate can be used in the stiffener. Through-hole 315 is drilled through core layer 320 to allow signals to be transmitted from metal layers L1-L3 on top of core layer 320 to metal layers L4-L6 at the bottom of core layer 320. In an exemplary embodiment, through-hole 315 is a plated through-hole (PTH). In the embodiment of FIG. 3A, stiffener 330 surrounds sides of core layer 320 and does not extend beyond through-hole 315.

Continuing from FIG. 3A, an IC chip may be mounted on top of package substrate 300 and signals from the IC chip are transmitted by solder bumps 302 through transmission traces 312, vias 310 and through-hole 315 to the bottom of package substrate 300. Solder balls, e.g., solder balls 104 of FIG. 1, may be placed on the bottom of package substrate 300 to transmit signals out of the IC chip through package substrate 300. For instance, signals may be transmitted out of the IC chip to a printed circuit board (PCB) through package substrate 300 or through a package-on-package (POP) configuration.

Figure 3B:
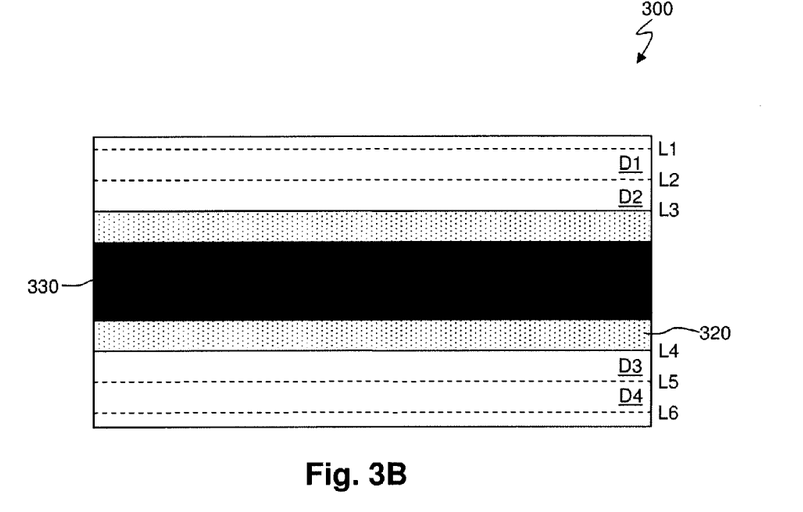
FIGS. 3B and 3C, meant to be illustrative and not limiting, show side views of the package substrate as embodiments in accordance with the present invention.
Figure 3C:
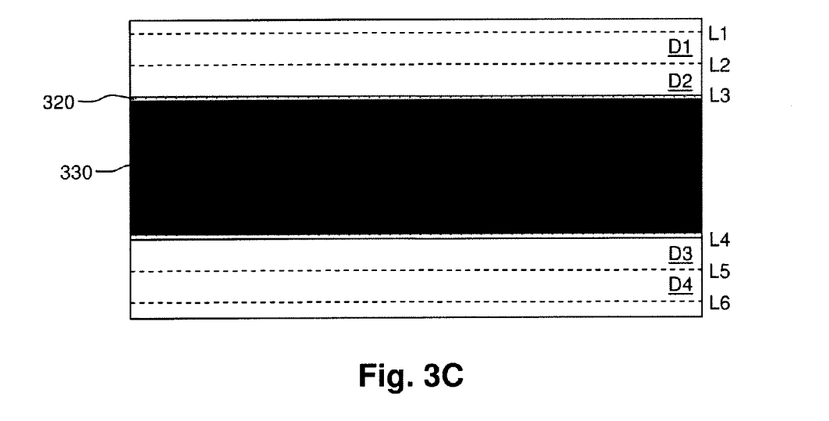

FIG. 3B, meant to be illustrative and not limiting, shows a side view of package substrate 300 as one embodiment in accordance with the present invention. For the sake of brevity, elements already shown in FIG. 3A and described above are not repeated. In the embodiment of FIG. 3B, the thickness of stiffener 330, embedded in core layer 320, is less than the thickness of core layer 320. In this embodiment, stiffener 330 is embedded substantially in the middle of core layer 320. It should be appreciated that the thickness of stiffener 330 may be varied based on the requirements of different types of IC devices and IC packages. FIG. 3C shows stiffener 330 that is almost as thick as core layer 320 as one embodiment in accordance with the present invention. In such an embodiment, if stiffener 330 is substantially as thick as core layer 320, an insulation layer is placed in between stiffener 330 and the adjacent metal layers at the top and bottom surfaces of core layer 320. Even though stiffener 330 is embedded in core layer 320 in the embodiments of FIGS. 3A-3C, it should be appreciated that stiffener 330 can also be embedded in one or more of build-up layers D1-D4. In one embodiment, stiffener 330 is embedded in a substantially middle layer in a multi-layer package substrate.

Figure 4A:
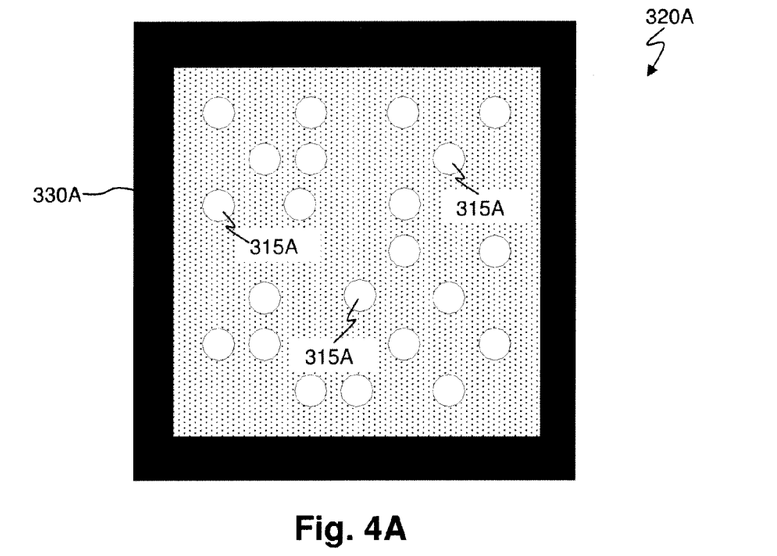
FIG. 4A, meant to be illustrative and not limiting, shows a cross section of a surface of a core layer as one embodiment in accordance with the present invention.

FIG. 4A, meant to be illustrative and not limiting, shows a cross section of a surface of core layer 320A as one embodiment in accordance with the present invention. In the embodiment of FIG. 4A, stiffener 330A surrounds the perimeter of core layer 320A. Through-holes or through-vias 315A are scattered on the surface of core layer 320A. Placing stiffener 330A at the perimeter of core layer 320A allows more space in the middle portion of core layer 320A for through-holes 315A. In one embodiment, having stiffener 330A at the perimeter of core layer 320A enhances the structure of core layer 320A and subsequently the overall structure of the package substrate. The width of stiffener 330A at each side of the surface of core layer 320A ranges from 2 mm-3 mm, according to one embodiment.

Figure 4B:
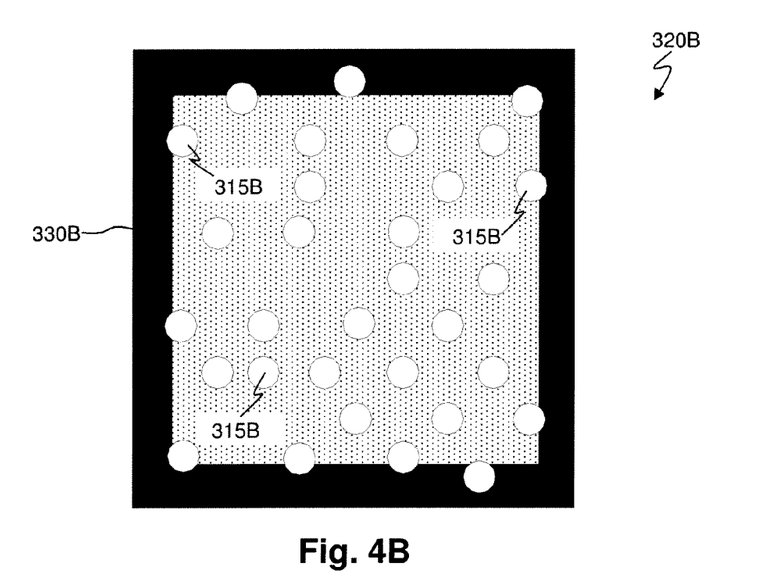
FIG. 4B, meant to be illustrative and not limiting, shows a cross section of a surface of an alternative core layer to the core layer of FIG. 4A as another embodiment in accordance with the present invention.

FIG. 4B, meant to be illustrative and not limiting, shows a cross section of a surface of core layer 320B as another embodiment in accordance with the present invention. In the embodiment of FIG. 4B, a portion of through-holes or through-vias 315B is placed relatively close to the edges of core layer 320B. Although layer 320B is referred to as a core layer, it should be appreciated that layer 320B may be any of the multiple layers in a multi-layer package substrate. According to one embodiment, layer 320B is a build-up layer in a multi-layer package substrate. According to another embodiment, layer 320B is one of the thickest layers in the multi-layer package substrate. Therefore, in such an embodiment, holes 315B are vias that connect one build-up layer to another.

Referring still to FIG. 4B, the inner peripheral surface of stiffener 330B conforms to the shape of side surfaces of vias 315B that are placed adjacent to stiffener 330B or in the peripheral area covered by stiffener 330B. In one embodiment, for vias 315B that overlap the inner boundary of stiffener 330B, the via holes are drilled through stiffener 330B. An insulation layer is generally placed in between the inner peripheral surface of stiffener 330B that is adjacent to the outer surface of the via holes before the via holes are plated. In one embodiment, the via holes are plated with a conductive material and stiffener 330B is a conductive material. As such, the insulation layer separates the adjacent vias 315B from stiffener 330B.

Figure 5A:
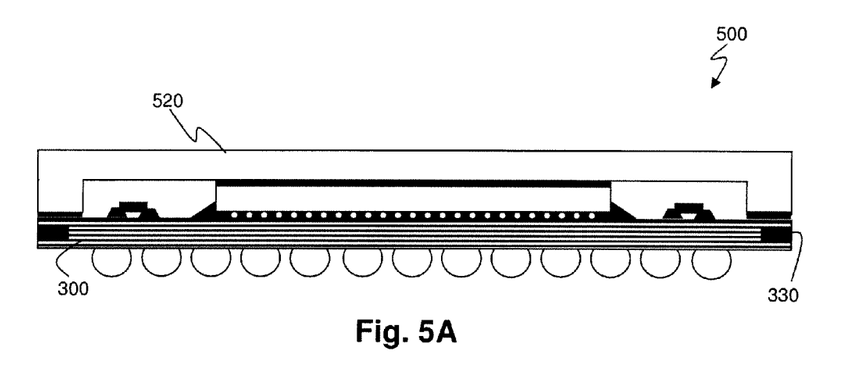
FIG. 5A, meant to be illustrative and not limiting, shows an exemplary IC package with a four-corner post lid as one embodiment in accordance with the present invention.

FIG. 5A, meant to be illustrative and not limiting, shows exemplary IC package 500 with a four-corner post lid 520 as one embodiment in accordance with the present invention. For the sake of brevity, components already shown in IC package 100 of FIG. 1 and described above are not repeated. In the embodiment of FIG. 5A, a four-corner post lid 520 is used in place of the two-piece lid 120 shown in the embodiment of FIG. 1. Package substrate 300 with embedded stiffener 330 is used in IC package 500. In the embodiment of FIG. 5A, a separate stiffener, e.g., stiffener 123 of FIG. 1, is not needed because the stiffener is embedded in package substrate 300. As such, substrate 300 is a relatively stronger structure compared to a package substrate without an embedded stiffener. It should be appreciated that four-corner post lid 520 has a surface with four posts or "legs" at each corner of package substrate 300.

Figure 5B:
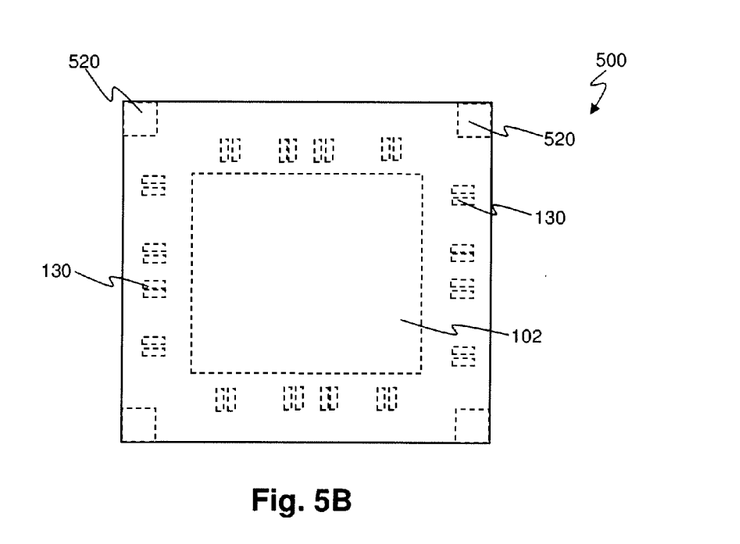
FIG. 5B, meant to be illustrative and not limiting, shows a top-down view of an IC package with a four-corner post lid of FIG. 5A.

FIG. 5B, meant to be illustrative and not limiting, shows a top-down view of IC package 500. Because the four posts of lid 520 only take up surface area of four corners of package substrate 300, the space that would otherwise be occupied by support member or metal stiffener 123 of FIG. 1 can be utilized by the many components, e.g., IC 102 and capacitors 103, in IC package 500. Therefore, surface area of package substrate 300 that would have been occupied by the stiffener can instead be occupied by capacitors 130. Even though there is even less contact area between four-corner post lid 520 and package substrate 300 compared to channel lid 202 and package substrate 108 of FIG. 2A, IC package 500 is a more reliable structure because package warpage is reduced with the embedded stiffener in package substrate 300.

Figure 6:
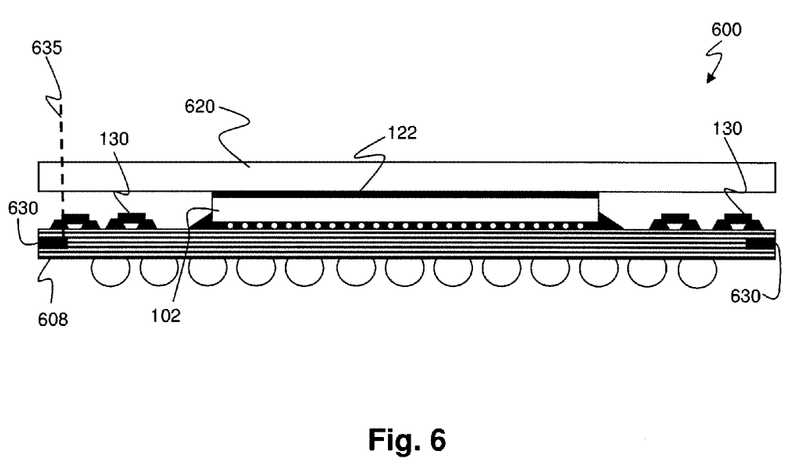
FIG. 6, meant to be illustrative and not limiting, shows IC package with a direct lid attach (DLA) module as one embodiment in accordance with the present invention.

FIG. 6, meant to be illustrative and not limiting, shows IC package with direct lid attach (DLA) module 620 as one embodiment in accordance with the present invention. In the embodiment of FIG. 6, there is no external stiffener module that is attached to the sides of DLA module 620 and the perimeter of the surface area of package substrate 608. DLA module 620 is attached solely to IC 102 through adhesive 122. DLA module 620 is attached such that DLA module 620 is substantially parallel to the surface of package substrate 608. Stiffener 630 is embedded in package substrate 608. In one embodiment, package substrate 608 is a multi-layer package substrate similar to package substrate 300 shown in FIG. 3A. Stiffener 630 can be embedded in one of the multiple dielectric layers in package substrate 608 in alternate embodiments.

Referring still to FIG. 6, because DLA module 620 is attached only to IC 102, the perimeter area of the surface of package substrate 608 is left unoccupied. In the embodiment of FIG. 1, the perimeter of the surface of the package substrate 108 is occupied by stiffener 123. Capacitors 130 may be placed substantially closer to edges of package substrate 608. In one embodiment, at least a few of capacitors 130 are placed such that they extend over a plane, shown as dotted line 635, that is orthogonal to a plane of stiffener 630. As such, more capacitors 130, or other components, may be placed in IC package 600. A larger die or another die like IC 102 can also be placed in IC package 600 as there is substantially more area on the surface of package substrate 608.

One skilled in the art will appreciate that specific flip chip packages with a ball grid array are provided in the exemplary illustrations of FIGS. 1, 2A, 5A and 6. However, this is not meant to be limiting as the techniques described herein may be applied to other packaging configurations, e.g., heat spreader ball grid array (HSBGA), low profile ball grid array (LBGA), thin fine pitch ball grid array (TFBGA), flip chip chip-scale package (FCCSP), etc.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package substrate, comprising:
    a core layer with a through-hole extending between opposing surfaces of the core layer;
    a stiffener embedded in the core layer, wherein the stiffener material surrounds a perimeter of the core layer;
    a plurality of metal layers with a plurality of transmission traces placed on each side of the opposing surfaces of the core layer; and
    a plurality of build-up layers, each having a plurality of vias, stacked alternately with the plurality of metal layers, the plurality of vias on each of the plurality of build-up layers connecting the plurality of transmission traces on one adjacent build-up layer to the plurality of transmission traces on another adjacent metal layer, wherein one or more of the plurality of vias at least partially overlaps an inner peripheral surface of the stiffener, and the inner peripheral surface of the stiffener conforms to a shape of an outer surface of the overlapping one or more of the plurality of vias.

2. The IC package substrate of claim 1, wherein the through-hole is a plated through-hole (PTH) and the stiffener surrounds an outer surface of the PTH.

3. The IC package substrate of claim 1, wherein the package substrate is in communication with an IC and a printed circuit board (PCB).

4. The IC package substrate of claim 1, wherein a thickness of the stiffener is less than a thickness of the core layer.

5. The IC package substrate of claim 1, wherein the core layer is composed of a non-conductive material and the stiffener is composed of a conductive material.

6. The IC package substrate of claim 1, wherein the stiffener is a metal having a coefficient of thermal extension (CTE) substantially similar to a CTE of the IC package substrate.

7. The IC package substrate of claim 1, wherein an insulation layer is placed in between the inner peripheral surface of the stiffener and the outer surface of the overlapping one or more of the plurality of vias.

8. An integrated circuit (IC) package, comprising:
    a package substrate having a plurality of build-up layers stacked alternately with a plurality of metal layers and a stiffener embedded along a perimeter of at least one of the plurality of build-up layers;
    a plurality of vias for connecting the plurality of metal layers to an exterior surface of the package substrate, wherein one or more of the plurality of vias are drilled through the stiffener, and wherein the one or more of the plurality of vias at least partially overlaps an inner peripheral surface of the stiffener;
    an IC disposed on a surface of the package substrate; and
    a heat spreader disposed over the IC on the surface of the package substrate.

9. The IC package of claim 8, wherein the at least one of the plurality of build-up layers is a core layer.

10. The IC package of claim 9, further comprising:
    an insulation layer separating the stiffener in the core layer from at least another layer of the plurality of layers.

11. The IC package of claim 8, wherein the stiffener is composed of copper.

12. The IC package of claim 8, wherein the plurality of build-up layers include a plurality of non-conductive dielectric layers and wherein the stiffener is composed of a conductive material.

13. The IC package of claim 8, wherein the heat spreader is a direct lid attach (DLA) module.

14. An integrated circuit (IC) package substrate, comprising:
    a plurality of build-up layers stacked alternately with a plurality of metal layers, each of the plurality of build-up layers having a plurality of vias connecting each of the plurality of build-up layers with an adjacent metal layer, wherein at least one of the plurality of build-up layers includes a stiffener embedded within an outer periphery of the at least one of the plurality of build-up layers,
    wherein a portion of an inner boundary of the stiffener conforms to an outer surface of one of the plurality of vias that at least partially overlaps the portion of the inner boundary, and wherein an insulation layer is disposed between the portion of the inner boundary and the outer surface of the one of the plurality of vias.

15. The IC package substrate of claim 14, further comprising:
    an IC disposed on a surface of the IC package substrate;
    a plurality of on-chip capacitors disposed on the surface of the IC package substrate surrounding the IC, wherein a portion of the on-chip capacitors is disposed along an outer perimeter of the surface of the IC package substrate, wherein the portion of the on-chip capacitors extends over a plane orthogonal to a plane of the stiffener; and
    a lid placed over a surface of the IC, wherein the lid is attached solely to the surface of the IC, and wherein a surface of the lid is substantially parallel to the surface of the IC package substrate.

16. The IC package substrate of claim 15, further comprising:
    another IC disposed on the surface of the IC package substrate.

17. The IC package substrate of claim 14, wherein the at least one layer is a thickest layer among the plurality of layers.

18. The IC package substrate of claim 14, wherein the IC package substrate is integrated in a flip-chip IC package.

19. The IC package substrate of claim 14, wherein the stiffener is thinner than the at least one of the plurality of layers.

20. The IC package substrate of claim 14, wherein the at least one of the plurality of layers is a core layer with a plated through-hole (PTH) and wherein the stiffener does not extend into the PTH.

* * * * *